United States Patent
Hofmann et al.

(10) Patent No.: US 12,196,260 B2
(45) Date of Patent: Jan. 14, 2025

(54) TREATMENT MACHINE, DRIVE UNIT FOR A TREATMENT MACHINE AND USE OF THE TREATMENT MACHINE

(71) Applicant: SINGULUS TECHNOLOGIES AG, Kahl am Main (DE)

(72) Inventors: Frank Hofmann, Wörth am Main (DE); Karl Schmitt, Sailauf (DE); Stefan Kempf, Alzenau (DE); Andreas Amrhein, Mespelbrunn (DE); Bernhard Cord, Alzenau (DE); Uwe Horlitz, Biebergemünd (DE)

(73) Assignee: SINGULUS TECHNOLOGIES AG, Kahl am Main (DE)

( * ) Notice: Subject to any disclaimer, the term of this patent is extended or adjusted under 35 U.S.C. 154(b) by 831 days.

(21) Appl. No.: 17/121,577

(22) Filed: Dec. 14, 2020

(65) Prior Publication Data
US 2021/0190131 A1 Jun. 24, 2021

(30) Foreign Application Priority Data
Dec. 19, 2019 (DE) .................... 10 2019 008 884.0

(51) Int. Cl.
*F16C 3/02* (2006.01)
*B05C 9/14* (2006.01)
(Continued)

(52) U.S. Cl.
CPC ............... *F16C 3/023* (2013.01); *B05C 9/14* (2013.01); *B21K 1/10* (2013.01); *C21D 9/28* (2013.01); *H01L 21/67103* (2013.01)

(58) Field of Classification Search
None
See application file for complete search history.

(56) References Cited

U.S. PATENT DOCUMENTS

| 5,034,588 A * | 7/1991 | Sheridan .................. C21D 9/28 |
| | | 219/652 |
| 5,090,350 A * | 2/1992 | Hammond .............. F26B 15/00 |
| | | 118/50 |

(Continued)

FOREIGN PATENT DOCUMENTS

| DE | 693659 | 7/1940 |
| DE | 3033689 | 4/1982 |

(Continued)

OTHER PUBLICATIONS

Rotary feedthrough. In: Wikipedia, The Free Encyclopedia. Processing status: Oct. 19, 2018. URL: http://de.wikipedia.org/w/index.php [accessed on Aug. 24, 2021].

(Continued)

*Primary Examiner* — Jethro M. Pence
(74) *Attorney, Agent, or Firm* — Branch Partners PLLC; Bruce E. Black

(57) ABSTRACT

A treatment machine comprises a chamber for the treatment of one substrate or a plurality of substrates. A rotatably supported temperature-controlled shaft (30) defines a cylindrical, gas-tight hollow space. A heating arrangement (40, 50) is provided for electrically heating at least a part of the shaft (30) arranged in the chamber. The heating arrangement (40, 50) comprises an accommodation mandrel (40) for accommodating at least one electrical heating element (50), said accommodation mandrel (40) being arranged in a non-rotating manner and extending into the hollow space of the shaft (30). An outer surface of the accommodation mandrel (40) is spaced apart from an inner surface of the shaft (30) by a gap.

23 Claims, 10 Drawing Sheets

(51) Int. Cl.
*B21K 1/10* (2006.01)
*C21D 9/28* (2006.01)
*H01L 21/67* (2006.01)

(56) References Cited

U.S. PATENT DOCUMENTS

| | | | |
|---|---|---|---|
| 5,247,158 | A | 9/1993 | Steinhauser et al. |
| 5,248,529 | A * | 9/1993 | Hammond ........ H01L 21/67196 |
| | | | 118/305 |
| 2009/0223551 | A1 | 9/2009 | Reddy et al. |

FOREIGN PATENT DOCUMENTS

| | | |
|---|---|---|
| DE | 102009016677 | 10/2010 |
| DE | 102011082334 | 3/2013 |
| EP | 0918945 | 3/2000 |
| EP | 2013375 A2 | 1/2009 |
| EP | 2013375 B1 | 3/2012 |
| JP | 2014222651 | 11/2014 |
| KR | 100990237 B1 * 10/2010 ........... H01L 21/324 |
| KR | 20190100787 | 8/2019 |

OTHER PUBLICATIONS

European Search Report for European Application No. 20212840.1 mailed May 7, 2021.

\* cited by examiner

TREATMENT MACHINE, DRIVE UNIT FOR A TREATMENT MACHINE AND USE OF THE TREATMENT MACHINE

CROSS-REFERENCE TO RELATED APPLICATIONS

This present application claims priority to German Patent Application No. DE 10 2019 008 884.0, filed Dec. 19, 2019, which is hereby incorporated by reference in its entirety.

FIELD OF THE INVENTION

The invention relates to devices and methods for treating substrates. The invention in particular relates to such devices and methods in which a heated shaft extends into a chamber.

TECHNICAL FIELD

Treatment machines for the treatment of substrates, which can be configured as continuous machines or as batch-type machines, are widely used. Exemplary machines are chalcogen vapor deposition machines or machines for the thermal treatment of substrates, for example to carry out a heat treatment of layers deposited onto the substrates.

It may be necessary or desirable to adjust the temperature of components present in a process chamber to a specific temperature or temperature range. For example, in chalcogen vapor deposition machines without such a temperature control, undesired high condensations may occur on non-temperature-controlled components of the treatment machine which are located close to the substrates or substrate carriers. Such depositions on components of the treatment machine can shorten the maintenance intervals in an undesirable way.

While the temperature control of stationary elements in the process chamber can usually be carried out with little effort, the temperature control of components extending into the process chamber, especially moving components in the process chamber, such as rotating shafts, may be technically more complex. In the case of shafts with temperature control by means of oil, for example, it may be difficult to avoid leakages on mechanical rotary transmission feedthroughs due to technical reasons. In the case of such shafts with temperature control by means of oil, heated thermal oil is typically introduced into a double-walled shaft through a mechanical rotary transmission feedthrough.

DE 10 2009 016 677 A1 describes a hollow shaft that can be heated with steam. The steam ducts render the configuration complex.

EP 0 918 945 B1 discloses a roller which can be heated and the roller body of which comprises channels with a vaporizable fluid, wherein an electrical radiant heating system is provided. The use of the channels in the roller body renders the configuration of the roller complex.

DE 693 659 A discloses an electrically heated calender roll the roll shell of which tightly encloses a roll core. The electrical components are stationarily installed.

DE 3 033 689 A1 discloses an electrically heatable roll with an inner tube and an outer tube coaxially arranged at a distance from the inner tube and forming a roll shell, said inner and outer tubes defining an annular space in which several heating mats butting against each other and being circumferentially distributed are inserted. Sliding contacts are provided for the energy supply of the heating mats. Such sliding contacts are susceptible to wear.

DE 10 2011 082 334 A1 describes a substrate treatment machine for treating disk-shaped substrates in a horizontal position with a transport device comprising a plurality of transport rollers with a hollow space in which a heating medium is arranged. The heating medium is to be insertable into the hollow space of the roller body from outside through a hollow shaft of a rotary transmission feedthrough. However, this design is disadvantageous, inter alia, because the provision of such a rotatably supported hollow shaft is technically complex, expensive and prone to errors.

There is a need for improved devices and methods by means of which the temperature of a shaft extending at least partially in a process chamber of a treatment machine can be controlled, in particular heated. In particular, there is a need for such devices and methods that allow temperature control of the shaft by means of a simple arrangement and that avoid the problem of liquid leakage, which may occur in the case of shafts with temperature control by means of oil or vapor.

SUMMARY OF THE INVENTION

According to the invention, a treatment machine, a drive unit and uses of such treatment machines and drive units comprising the features specified in the independent claims are provided. The dependent claims define preferred embodiments.

According to the invention, a configuration is proposed in which an electrical heating device, in particular a heating cartridge, is arranged in a non-rotating manner in the interior of a shaft. An accommodation mandrel is provided to accommodate an electrical heating device or heating cartridge. The accommodation mandrel is arranged in a non-rotating manner relative to a chamber of the treatment machine.

A gap extends between an outer surface of the accommodation mandrel and an inner surface of the shaft. Heat transfer between the accommodation mandrel and the rotatably supported shaft can take place in particular by means of a gas provided between the shaft and the accommodation mandrel. The heat transfer can essentially take place by means of heat conduction through this gas in the interior of the shaft.

The leakages on rotary transmission feedthroughs frequently occurring in the case of temperature control by means of oil can be prevented by using an electrically temperature-controlled shaft. The treatment machine and the drive unit used therein are robust and of a mechanically simple design.

By using an accommodation mandrel that does not rotate relative to the chamber, a heating cartridge or any other electrical heating device can be arranged and electrically connected in the accommodation mandrel in such a way that it is reversibly removable in an easy and non-destructive manner.

It is not necessary to provide a slip ring contact as would be necessary in the case of a rotating heating cartridge. Such a slip ring contact would be more complicated to implement and could shorten the maintenance intervals in an undesirable way.

In addition, it is difficult to measure/control the temperature of a rotating shaft since the thermoelectric voltages would also have to be tapped via slip rings.

The stationary accommodation mandrel, i.e., the accommodation mandrel not rotating during operation, may be configured to accommodate conventional heating cartridges, in particular standard heating cartridges.

The accommodation mandrel may be configured such that it is relatively resistant to bending and can also be used for shafts having a length of more than 600 mm.

A treatment machine according to the invention comprises a chamber for the treatment of one or more substrates. A rotatably supported temperature-controlled shaft is provided. The shaft defines a cylindrical, advantageously gas-tight, hollow space. The treatment machine comprises a heating arrangement for electrically heating at least a part of the shaft arranged in the chamber. The heating arrangement comprises an accommodation mandrel for accommodating an electrical heating device, said accommodation mandrel being arranged in a non-rotating manner and extending into the hollow space of the shaft. An outer surface of the accommodation mandrel is spaced apart from an inner surface of the shaft by a gap.

If the shaft defines a gas-tight hollow space, the hollow space defined by the shaft is gas-tight with respect to a treatment space defined in the interior of the chamber. However, it is not excluded that even in the case of a "gas-tight hollow space" the hollow space in the interior of the shaft comprises openings that allow gas to pass between the hollow space in the interior of the shaft and a volume outside the treatment space. For example, even in the case of a hollow space that is configured to be gas-tight (which means in particular a hollow space that is sealed against the treatment space), ambient air may be able to enter the hollow space in the interior of the shaft from volumes outside the treatment space and/or air may be able to exit the hollow space in the interior of the shaft into volumes outside the treatment space. Alternatively or additionally, feedthroughs may be provided, for example for introducing a heat-conducting fluid into the hollow space and/or for removing a heat-conducting fluid from the hollow space, wherein the gas exchange between the treatment space of the chamber and the hollow space in the interior of the shaft remains prevented.

At least a part of the shaft may extend in a treatment space defined by the chamber.

The electrical heating device may be a heating cartridge or may comprise a heating cartridge.

The shaft may be configured to be dividable.

The shaft may be configured to be dividable such that it is mountable at the chamber in at least two different orientations. This renders the treatment machine reconfigurable such that depending on how the shaft is mounted the heating cartridge is insertable into the accommodation mandrel from different side walls of the chamber.

Dividable connections of the shaft may be provided with a seal to seal a volume defined between the accommodation mandrel and the inner surface of the shaft against a treatment space defined by the chamber.

The treatment machine may further comprise an evacuation device for evacuating the treatment space.

The treatment machine may be configured such that the treatment space is evacuable to a static pressure of less than 1 Pa, in particular less than 0.1 Pa, in particular less than $10^{-2}$ Pa, in particular less than $10^{-3}$ Pa and in particular less than $10^{-4}$ Pa.

The treatment machine may be configured to maintain an overpressure in a volume defined between the accommodation mandrel and the shaft relative to a treatment space defined by the chamber.

The treatment machine may be configured to maintain the volume defined between the accommodation mandrel and the shaft at atmospheric pressure when evacuating the treatment space.

Optionally, a gaseous medium, in particular air, helium or hydrogen, may be present in the volume defined between the accommodation mandrel and the shaft.

The gap between the outer surface of the accommodation mandrel and the inner surface of the shaft may be greater than 0.3 mm, in particular greater than 0.5 mm, in particular greater than 0.7 mm, in particular greater than 1 mm.

The gap between the outer surface of the accommodation mandrel and the inner surface of the shaft may be smaller than 4 mm, in particular smaller than 3 mm, in particular smaller than 2.2 mm, in particular smaller than 1.9 mm.

The gap can be measured in a central plane between the walls of the chamber extending perpendicularly to the rotation axis of the shaft. If the distance between the outer surface of the accommodation mandrel and the inner surface of the shaft (in each case measured along a radial direction from the central axis of the shaft) varies along the circumference of the accommodation mandrel, the gap can be defined as the circumferentially averaged distance.

The gap between the outer surface of the accommodation mandrel and the inner surface of the shaft may be dimensioned such that the inner surface of the shaft is rotatable around the outer surface of the accommodation mandrel without any contact.

The outer surface of the accommodation mandrel may have a diameter of at least 15 mm, in particular at least 20 mm, in particular at least 22 mm.

The diameter of the outer surface of the accommodation mandrel can be measured in a central plane between the walls of the chamber extending perpendicularly to the rotation axis of the shaft. If the radius of the outer surface of the accommodation mandrel (in each case measured along a radial direction from the central axis of the accommodation mandrel) varies along the circumference of the accommodation mandrel, the diameter can be defined as the circumferentially averaged diameter.

The outer surface of the accommodation mandrel may be blackened. Heat transfer by thermal radiation can thus be improved.

The inner surface of the accommodation mandrel may be blackened. Heat transfer by thermal radiation can thus be improved.

A thermal conductivity between the outer surface of the accommodation mandrel and the inner surface of the shaft per unit of axial length of the outer surface of the accommodation mandrel may be at least 0.4 W/(K·m), at least 0.5 W/(K·m), at least 0.6 W/(K·m), at least 0.8 W/(K·m) or at least 0.9 W/(K·m).

The thermal conductivity between the outer surface of the accommodation mandrel and the inner surface of the shaft per unit of axial length of the outer surface of the accommodation mandrel may be maximally 9 W/(K·m), maximally 8 W/(K·m), maximally 7 W/(K·m), maximally 6 W/(K·m) or maximally 4 W/(K·m).

The outer surface of the accommodation mandrel may be cylindrical along at least a portion of the accommodation mandrel.

The outer surface of the accommodation mandrel may comprise portions having different outer cross-sections arranged along an axis of the accommodation mandrel. This facilitates the arrangement of bearings with smaller diameters, e.g., in areas at the tail of the accommodation mandrel.

The treatment machine may further comprise at least one bearing between the accommodation mandrel and the inner surface of the shaft.

The shaft may be rotatably connected to the chamber via at least one further bearing.

The accommodation mandrel may have a maximum wall thickness of at least 2 mm, of at least 3 mm or of at least 4.5 mm.

The maximum wall thickness of the accommodation mandrel can be measured in a central plane between the walls of the chamber extending perpendicularly to the rotation axis of the shaft.

The accommodation mandrel may define a further cylindrical hollow space in its interior.

The treatment machine may comprise an electrical heating device, in particular a heating cartridge, which is or can be arranged in the further cylindrical hollow space of the accommodation mandrel.

The heating cartridge may be a single-piece element that is insertable into the hollow space of the accommodation mandrel.

The heating cartridge and the accommodation mandrel may be configured such that the heating cartridge is reversibly insertable into and removable from the accommodation mandrel in a non-destructive manner.

A configuration of the heating cartridge may be adapted to a position of a seal or bearing that may be provided between the accommodation mandrel and the shaft and/or between different parts of the shaft that are detachably connectable to each other.

The heating cartridge may be configured such that active heating elements are only arranged in an area of the heating cartridge that ends (viewed in the axial direction of the shaft) at a distance from the seal and/or bearing.

An outer surface of the heating cartridge arranged in the accommodation mandrel may be spaced apart from an inner surface of the accommodation mandrel by at most 1 mm, by at most 0.5 mm or by at most 0.25 mm.

A further cylindrical hollow space in the interior of the accommodation mandrel may comprise a material that is provided between the heating cartridge and the accommodation mandrel. In particular, there may be a casting material between the heating cartridge or electrical heating element and the accommodation mandrel, by means of which the electrical heating element is permanently integrated into the accommodation mandrel. Suitable casting materials are, for example, temperature-resistant heat-conducting media, preferably on a metallic basis. For example, a silver paste from the company PELCO may be used.

Accordingly, the electrical heating element may also be an integral component of the accommodation mandrel. In the case of this embodiment, the electrical heating element preferably cannot be removed from the accommodation mandrel in a reversible and non-destructive manner. Rather, the accommodation mandrel is replaced together with the heating element if a replacement of the heating element becomes necessary. Accordingly, the accommodation mandrel preferably can be removed in a reversible and non-destructive manner from the hollow space of the shaft to replace the electrical heating element. This involves the advantage that the possibly sensitive heating element cannot be accidentally damaged when it is inserted into the accommodation mandrel. Rather, the heating element and the accommodation mandrel form a compact, dimensionally stable unit. Furthermore, a particularly good heat conduction from the heating element into the mandrel can be achieved in the case of this arrangement. For this purpose, it is preferred that the material provided between the heating cartridge and the accommodation mandrel has a thermal conductivity of at least 4 W/(K·m), more preferably of at least 6 W/(K·m) and particularly preferably of at least 8 W/(K·m).

The accommodation mandrel comprises a first end on the side of the access to the hollow space of the shaft and an opposite second end. Preferably, the accommodation mandrel is supported at its second end in the hollow space of the shaft. In order to facilitate the correct positioning of the second end in this bearing when the accommodation mandrel is inserted, the accommodation mandrel preferably has a taper or other guiding device at its second end to be inserted into the bearing.

When the heating cartridge and the accommodation mandrel are not connected to each other via a casting material, the material provided between the heating cartridge and the accommodation mandrel may have a thermal conductivity of at least 0.05 W/(K·m) or at least 0.1 W/(K·m).

The accommodation mandrel may comprise one or a combination of the following materials: structural steel such as ST 37-2 or S235JR (according to EN 100025-2), stainless steel, aluminum, aluminum alloys as well as other metals or metal alloys having sufficiently high thermal conductivity.

Preferably, the accommodation mandrel is black-oxide finished to blacken the surface.

The shaft may have a length of at least 600 mm.

The heating arrangement may be configured to heat the shaft to a temperature between 140° C. and 220° C.

The heating arrangement may be configured to heat the shaft to a temperature between 160° C. and 200° C.

The heating arrangement may be configured to heat the shaft to a temperature of approximately 180° C.

The treatment machine may be a coating machine.

The treatment machine may comprise a source of reactive gas or reactive vapor.

The treatment machine may be a machine for the vapor deposition of materials at temperatures of the chamber wall and/or installed components of at least 140° C., for example, for the vapor deposition of chalcogens, in particular selenium.

The treatment machine may be a machine for thermal treatment.

The treatment machine may comprise a temperature control for controlling a temperature of the electrical heating device located in the accommodation mandrel in an open loop or in a closed loop mode.

The temperature control may comprise at least one thermocouple element.

A drive unit for a treatment machine according to the invention comprises a rotating shaft. The shaft defines a cylindrical hollow space. The drive unit comprises a heating arrangement for electrically heating at least a part of the shaft, wherein the heating arrangement comprises an accommodation mandrel for accommodating an electrical heating device, in particular a heating cartridge, which is mountable in a non-rotating manner and which extends into the hollow space of the shaft, wherein an outer surface of the accommodation mandrel is spaced apart from an inner surface of the shaft by a gap.

The drive unit may comprise a thermocouple element for temperature control of the heating arrangement in a closed loop mode.

The shaft may be configured to be dividable, wherein each of one or more dividable connections of the shaft is provided with a seal to seal a volume defined between the accommodation mandrel and the inner surface of the shaft against a treatment space.

The drive unit may comprise an electrical heating device, in particular a heating cartridge, which is or can be arranged in a further cylindrical hollow space of the accommodation mandrel.

A configuration of the heater cartridge may thus be adapted to a position of a seal or bearing that may be provided between the accommodation mandrel and the shaft and/or between different parts of the shaft that are detachably connectable to each other.

The heating cartridge may be configured such that active heating elements are only arranged in an area of the heating cartridge that ends (viewed in the axial direction of the shaft) at a distance from the seal and/or bearing.

The drive unit may be configured such that it is mountable at the treatment machine in two different orientations. This renders the treatment machine easily reconfigurable such that the heating cartridge is insertable into the accommodation mandrel from different sides of the treatment machine.

The drive unit may be configured for use in the treatment machine according to the invention. Further optional features of the drive unit correspond to the features explained with reference to the treatment machine.

According to the invention, a method is specified which comprises: rotating a rotatably supported element in a chamber of a treatment machine, wherein the treatment machine is a treatment machine according to the invention and/or comprises a drive unit according to the invention.

The method may be a method for coating substrates.

The method may be a method for thermally treating substrates, for example, for thermally treating layers deposited onto the substrates.

The treatment machine according to the invention, the drive unit according to the invention and the uses according to the invention allow temperature control of the shaft by means of a simple arrangement when treating substrates and avoid the problem of liquid leakage.

Aspects of the invention include the following:
1. A treatment machine comprising:
   a chamber (11) for the treatment of one substrate (18) or a plurality of substrates (18),
   a rotatably supported temperature-controlled shaft (30), wherein said shaft (30) defines a cylindrical, gas-tight hollow space, and
   a heating arrangement (40, 50) for electrically heating at least a part of the shaft (30) arranged in the chamber (11),
   wherein said heating arrangement (40, 50) comprises an accommodation mandrel (40) for accommodating at least one electrical heating element (50), in particular a heating cartridge, said accommodation mandrel (40) being arranged in a non-rotating manner and extending into the hollow space of the shaft (30),
   wherein an outer surface (41) of the accommodation mandrel (40) is spaced apart from an inner surface (31) of the shaft (30) by a gap (39).
2. The treatment machine according to aspect 1, wherein the shaft (30) is configured to be dividable, wherein dividable connections of the shaft (30) are provided with a seal (37, 38) to seal a volume defined between the accommodation mandrel (40) and the inner surface (31) of the shaft (30) against a treatment space (15) defined by the chamber (11).
3. The treatment machine according to aspect 1 or aspect 2, further comprising an evacuation device for evacuating the treatment space (15).
4. The treatment machine according to aspect 3, wherein the treatment space (15) is evacuable to a static pressure of less than 1 Pa, in particular less than 0.1 Pa, in particular less than $10^{-2}$ Pa, in particular less than $10^{-3}$ Pa and in particular less than $10^{-4}$ Pa.
5. The treatment machine according to any one of the preceding aspects, wherein said treatment machine (10) is configured to maintain an overpressure in a volume defined between the accommodation mandrel (40) and the shaft (30) relative to a treatment space (15) defined by the chamber (11), in particular to maintain the pressure in the volume defined between the accommodation mandrel (40) and the shaft (30) at atmospheric pressure when evacuating the treatment space (15), wherein optionally a gaseous medium, in particular air, helium or hydrogen, is present in the volume defined between the accommodation mandrel (40) and the shaft (30).
6. The treatment machine according to any one of the preceding aspects,
   wherein the gap (39) between the outer surface (41) of the accommodation mandrel (40) and the inner surface (31) of the shaft (30) is greater than 0.3 mm, greater than 0.5 mm, greater than 0.7 mm or greater than 1 mm.
7. The treatment machine according to any one of the preceding aspects,
   wherein the gap (39) between the outer surface (41) of the accommodation mandrel (40) and the inner surface (31) of the shaft (30) is smaller than 3 mm, smaller than 2.2 mm or smaller than 1.9 mm.
8. The treatment machine according to aspect 7, wherein the gap (39) is dimensioned such that the inner surface (31) of the shaft (30) is rotatable around the outer surface (41) of the accommodation mandrel (40) without any contact.
9. The treatment machine according to any one of the preceding aspects, wherein the outer surface (41) of the accommodation mandrel (40) has a diameter of at least 15 mm, at least 20 mm or at least 22 mm.
10. The treatment machine according to any one of the preceding aspects, wherein the outer surface (41) of the accommodation mandrel (40) and/or the inner surface (31) of the shaft (30) are blackened.
11. The treatment machine according to any one of the preceding aspects, wherein a thermal conductivity between the outer surface (41) of the accommodation mandrel (40) and the inner surface (31) of the shaft (30) per unit of axial length of the outer surface (41) of the accommodation mandrel (40) is at least 0.4 W/(K·m) or at least 0.5 W/(K·m).
12. The treatment machine according to any one of the preceding aspects, wherein the outer surface (41) of the accommodation mandrel (40) is cylindrical along at least a portion of the accommodation mandrel (40).
13. The treatment machine according to aspect 12, wherein the outer surface (41) of the accommodation mandrel (40) comprises portions having different outer cross-sections arranged along an axis of the accommodation mandrel (40).
14. The treatment machine according to any one of the preceding aspects, wherein the shaft (30) is rotatably connected to the chamber (11) via at least one bearing (14).
15. The treatment machine according to any one of the preceding aspects, further comprising at least one bearing (60) between the accommodation mandrel (40) and the inner surface (31) of the shaft (30).
16. The treatment machine according to any one of the preceding aspects, wherein the accommodation mandrel (40) defines a further cylindrical hollow space in its interior.

17. The treatment machine according to aspect 16, further comprising a heating cartridge (50), which is or can be arranged in the further cylindrical hollow space of the accommodation mandrel (40).
18. The treatment machine according to aspect 17, wherein a configuration of the heating cartridge (50) is adapted to a position of a seal (16, 17, 37, 38) or a bearing (14, 60), wherein in particular the heating cartridge (50) is configured such that an area (51) of the heating cartridge (50) containing active heating elements ends at a distance from the seal (16, 17, 37, 38) or the bearing (14, 60).
19. The treatment machine according to aspect 17 or aspect 18, wherein an outer surface (41) of the heating cartridge (50) arranged in the accommodation mandrel (40) is spaced apart from an inner surface (31) of the accommodation mandrel (40) by at most 1 mm, 0.5 mm or 0.25 mm.
20. The treatment machine according to aspect 18 or aspect 19, wherein the further cylindrical hollow space comprises a material between the heating cartridge (50) and the accommodation mandrel (40), wherein said material has a thermal conductivity of at least 0.05 W/(K·m), in particular of at least 0.1 W/(K·m), preferably of at least 4 W/(K·m), more preferably of at least 6 W/(K·m).
21. The treatment machine according to any one of the preceding aspects, wherein the electrical heating element (50) is an integral component of the accommodation mandrel (40), preferably cast with it.
22. The treatment machine according to any one of the preceding aspects, wherein the accommodation mandrel (40) can be removed from the hollow space of the shaft (30) to replace the electrical heating element (50).
23. The treatment machine according to aspect 22, wherein the accommodation mandrel is supported at its distal end in the hollow space of the shaft (30) and comprises a taper at its distal end to be inserted into the bearing (60).
24. The treatment machine according to any one of the preceding aspects, wherein the shaft (30) has a length of at least 600 mm.
25. The treatment machine according to any one of the preceding aspects, wherein the heating arrangement (40, 50) is configured to heat the shaft (30) to a temperature between 140° C. and 220° C., in particular to approximately 180° C.
26. The treatment machine according to any one of the preceding aspects, wherein said treatment machine is a coating machine.
27. The treatment machine according to aspect 26, further comprising a source of reaction gas or reaction vapor.
28. The treatment machine according to aspect 26 or aspect 27, wherein said treatment machine is a machine for the vapor deposition of materials at temperatures of at least 140° C. of the chamber wall and installed components, for example, for the vapor deposition of chalcogens, in particular selenium.
29. The treatment machine according to any one of the preceding aspects, wherein said treatment machine is a machine for thermal treatment.
30. The treatment machine according to aspect 29, further comprising a temperature control for controlling a temperature of the heating device (50) located in the accommodation mandrel (40) in an open loop or in a closed loop mode.
31. A drive unit (20a-c) for a treatment machine (10), comprising:
a rotating shaft (30), wherein said shaft (30) defines a cylindrical hollow space, and
a heating arrangement (40, 50) for electrically heating at least a part of the shaft (30), wherein said heating arrangement (40, 50) comprises an accommodation mandrel (40) for accommodating at least one electrical heating element (50), in particular a heating cartridge, which accommodation mandrel (40) is mountable in a non-rotating manner and which extends into the hollow space of the shaft (30), wherein an outer surface (41) of the accommodation mandrel (40) is spaced apart from an inner surface (31) of the shaft (30) by a gap (39).
32. The drive unit according to aspect 31, further comprising a thermocouple element for controlling a temperature of the heating arrangement (40, 50) in a closed loop mode.
33. The drive unit according to aspect 30 or aspect 32, wherein the shaft (30) is configured to be dividable, wherein dividable connections of the shaft (30) are provided with a seal (37, 38) to seal a volume defined between the accommodation mandrel (40) and the inner surface (31) of the shaft (30) against a treatment space (15).
34. The drive unit according to aspects 31 to 33, further comprising a heating cartridge (50), which is or can be arranged in a further cylindrical hollow space of the accommodation mandrel (40).
35. The drive unit according to aspect 34, wherein a configuration of the heating cartridge (50) is adapted to a position of a seal (16, 17, 37, 38) or a bearing (14, 60), wherein in particular the heating cartridge (50) is configured such that an area (51) of the heating cartridge (50) containing active heating elements ends at a distance from the seal (16, 17, 37, 38) or the bearing (14, 60).
36. The drive unit according to any one of aspects 31 to 35, wherein the electrical heating element (50) is an integral component of the accommodation mandrel (40), preferably cast with it.
37. The drive unit according to any one of aspects 31 to 36, wherein the accommodation mandrel (40) can be removed from the hollow space of the shaft (30) to replace the electrical heating element (50).
38. The drive unit according to aspect 37, wherein the accommodation mandrel is supported at its distal end in the hollow space of the shaft (30) and comprises a taper at its distal end to be inserted into the bearing (60).
39. The drive unit according to any one of aspects 31 to 38, which is configured to be used in the treatment machine (10) according to any one of aspects 1 to 30.
40. Use of the treatment machine (10) according to any one of aspects 1 to 30 or the drive unit (20a-20c) according to any one of aspects 31 to 39 for coating substrates (18).
41. Use of the treatment machine (10) according to any one of aspects 1 to 30 or the drive unit (20a-20c) according to any one of aspects 31 to 39 for a thermal treatment of substrates (18).

SHORT DESCRIPTION OF THE FIGURES

Preferred embodiments of the invention are described in detail below with reference to the Figures, in which identical reference signs denote identical or similar elements.

DESCRIPTION OF PREFERRED EMBODIMENTS

While preferred or advantageous embodiments are described with reference to the Figures, additional or alternative configurations can be realized in further embodiments.

While, for example, with reference to the Figures, embodiments are explained in the context of continuous machines in which a temperature-controlled shaft is used to transport substrates or substrate carriers, the embodiments are not limited thereto. While embodiments are described in the context of treatment machines for vapor phase deposition or thermal treatment, the disclosed embodiments can also be used for other purposes.

Figure 1:
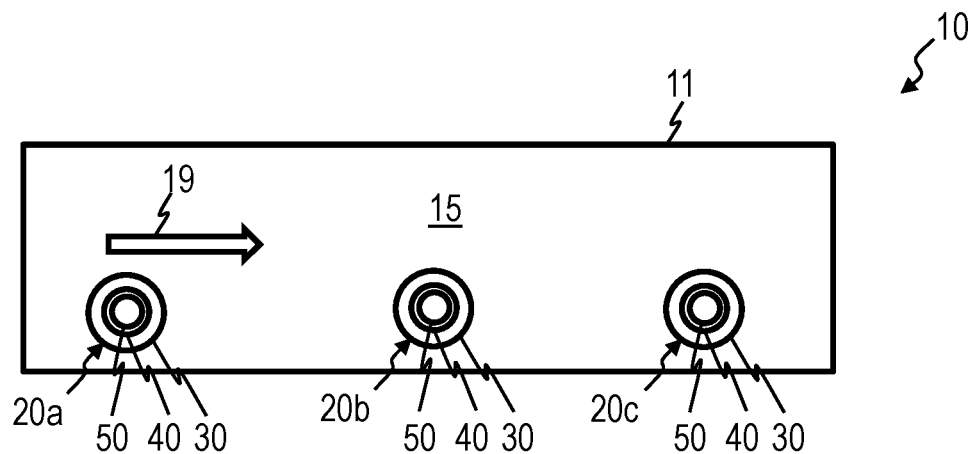
FIG. 1 shows a side view of a treatment machine according to a preferred embodiment.

FIG. 1 shows a side view of a treatment machine 10 according to the invention. The treatment machine 10 comprises a chamber 11, which defines a treatment space 15 in its interior. The treatment machine 10 may be configured as a continuous machine or as a batch-type machine. A plurality of drive units 20a, 20b, 20c may be mounted at the chamber 11 to move substrates or a substrate carrier along a transport direction 19.

Alternatively or additionally, drive units comprising a temperature-controlled shaft according to the invention may also be provided for other purposes, for example, for rotating substrates.

Each of the drive units 20a, 20b, 20c may comprise a shaft 30 rotatably supported relative to chamber 11, an accommodation mandrel 40 and an electrical heating device 50 accommodated in the accommodation mandrel 40. The accommodation mandrel 40 and the electrical heating device 50 may form an electrical heating arrangement.

The accommodation mandrel 40 is mounted in a non-rotating manner so that it does not rotate relative to the chamber 11 even when the shaft 30 is rotating. The accommodation mandrel 40 extends into the shaft 30 such that the shaft 30 is rotatable around the accommodation mandrel 40 without any contact.

Figure 2:
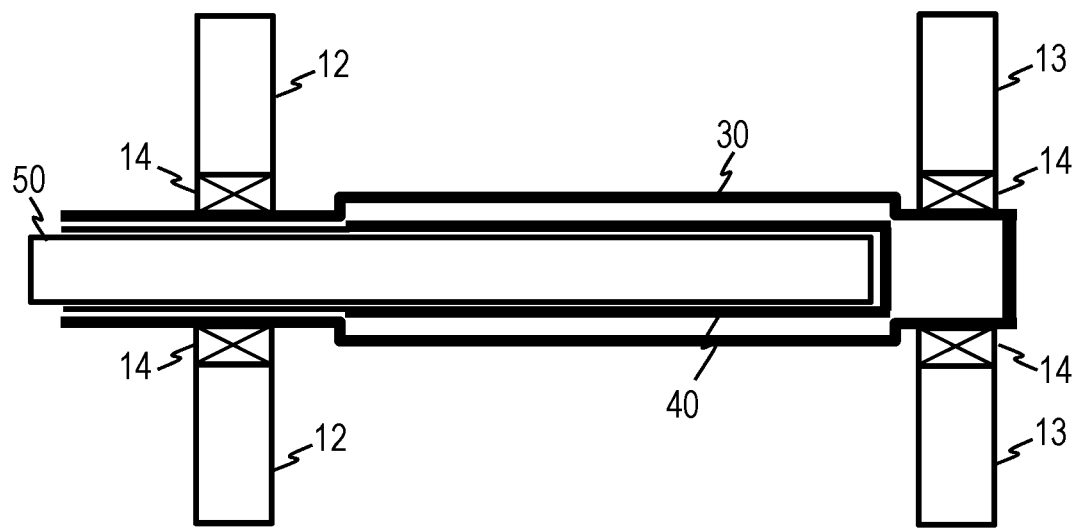
FIG. 2 shows a sectional view through the treatment machine in a sectional plane containing a rotation axis of a temperature-controlled shaft.

FIG. 2 shows a sectional view through an exemplary drive unit 20 in a sectional plane containing a rotation axis of the shaft 30. The shaft 30 may be rotatably supported at opposite side walls 12, 13 by bearings 14. One or more bearings (not shown in FIG. 2) may be provided between the accommodation mandrel 40 and the shaft 30.

The treatment machine 10 may be configured such that the treatment space 15 can be evacuated to a static pressure of less than 1 Pa, in particular less than 0.1 Pa, in particular less than $10^{-2}$ Pa, in particular less than $10^{-3}$ Pa and in particular less than $10^{-4}$ Pa. For that purpose, appropriate pumps and optionally controllable valve arrangements may be provided. The treatment machine may comprise vacuum locks (not shown) for inserting substrates into the treatment space 15 therethrough and/or removing substrates from the treatment space 15 therethrough.

The shaft 30 is configured such that a hollow space defined in the interior of the shaft 30 is sealed in a gas-tight manner against the treatment space 15. If the shaft 30 is configured as a multi-part shaft, the shaft may comprise seals between different parts of the shaft 30 to seal the inner volume of the shaft 30 against the treatment space 15.

During the operation of the treatment machine 10, an overpressure may prevail in the inner volume of the shaft 30 in comparison to the pressure in the treatment space 15. This allows good thermal conductivity to be achieved by heat transfer between the accommodation mandrel 40 and the shaft 30 via a gas or gas mixture present in the inner volume of the shaft 30.

The accommodation mandrel 40 may be configured to have an outer diameter and/or a wall thickness that ensures a relatively high bending stiffness even when used in a long shaft 30 having a length of more than 600 mm. The outer surface of the accommodation mandrel 40 may have a diameter of at least 15 mm, in particular at least 20 mm, in particular at least 22 mm. The accommodation mandrel 40 may have a maximum wall thickness of at least 2 mm, at least 3 mm or at least 4.5 mm.

An electrical heating device 50 may be insertable into the accommodation mandrel 40. The electrical heating device 50 may be configured in one piece so that it is easily insertable into and removable from the accommodation mandrel 40. The electrical heating device 50 may be a conventional heating cartridge comprising a housing and one or more active heating elements arranged in the housing of the heating cartridge.

The electrical heating device 50 and the accommodation mandrel 40 are configured such that the electrical heating device 50 is separated from an inner surface of the accommodation mandrel 40 by a relatively small gap when inserted into the accommodation mandrel 40. An outer surface of the heating cartridge 50 arranged in the accommodation mandrel may be spaced apart from an inner surface of the accommodation mandrel 40 by at most 1 mm, by at most 0.5 mm or by at most 0.25 mm. In the case of the above-discussed variant comprising a cast heating element, this distance may also be greater since in this case the greater distance can be compensated for by means of a material having a higher thermal conductivity.

In order to ensure good heat transfer from the electrical heating device 50 to the accommodation mandrel 40, a medium, in particular a gaseous medium, may be provided in the interior of the accommodation mandrel 40 between the accommodation mandrel 40 and the electrical heating device 50. The medium provided in the interior of the accommodation mandrel 40 may comprise a thermal conductivity λ of at least 0.05 W/(K·m)) or at least 0.1 W/(K·m). As already mentioned above, in the case of the above-discussed variant comprising a cast heating element, the material provided between the heating cartridge and the accommodation mandrel may have a thermal conductivity of at least 4 W/(K·m), more preferably of at least 6 W/(K·m) and particularly preferably of at least 8 W/(K·m).

Due to the fact that the accommodation mandrel 40 and the electrical heating device 50 do not rotate, it becomes possible to separate these two components by only a small gap so that a good heat transfer can be achieved. Therefore, the electrical heating device 50 can be easily replaced. This is particularly the case when the electrical heating device 50 is not attached to any functional element such as, for example, support bearings. Thus, the electrical heating device 50 may have a relatively small diameter. Any deflection of the electrical heating device 50 is limited by the accommodation mandrel. The electrical heating device 50 can be reversibly removed in a non-destructive manner through a small opening diameter on the drive side of the rotary transmission feedthrough.

Due to its larger diameter, the accommodation mandrel 40 has a higher bending stiffness and thus ensures low deflection even in the case of a long shaft 30. Therefore, a gap relative to the rotating shaft 30 can be kept relatively consistent both over the circumference of the accommodation mandrel 40 and along the longitudinal direction of the shaft 30, i.e. with only small deviations over the circumference and the longitudinal direction of the shaft 30. Again, this allows the gap between the rotating shaft 30 and the accommodation mandrel 40 to be set relatively small.

For example, the gap between the outer surface of the accommodation mandrel 40 and the inner surface of the shaft 30 may be less than 4 mm, less than 3 mm, less than 2.2 mm or less than 1.9 mm.

The gap between the outer surface of the accommodation mandrel 40 and the inner surface of the shaft 30 may be greater than 0.3 mm, greater than 0.5 mm, greater than 0.7 mm or greater than 1 mm to eliminate or reduce the risk of contact between the accommodation mandrel 40 and the shaft 30 during operation.

The gap between the rotating shaft 30 and the accommodation mandrel 40 is larger than the distance between the heating device 50 and the accommodation mandrel 40.

A good heat transfer of thermal energy from the accommodation mandrel 40 to the shaft 30 can be achieved by using a gap between the outer surface of the accommodation mandrel 40 and the inner surface of the shaft 30 that is, for example, larger than 0.3 mm and smaller than 4 mm.

A thermal conductivity per axial length of shaft 30 can be defined as $$Q/t/|T_1-T_2|, \tag{1}$$

wherein Q denotes a thermal energy transferred in a time t per unit of length of the shaft 30 and $|T_1-T_2|$ denotes an absolute value of a temperature difference between an inner surface of the shaft 30 and an outer surface of the accommodation mandrel 40.

The thermal conductivity between the outer surface of the accommodation mandrel 40 and the inner surface of the shaft 30 per unit of axial length of the outer surface of the accommodation mandrel 40 may be at least 0.4 W/(K·m), at least 0.5 W/(K·m), at least 0.6 W/(K·m), at least 0.8 W/(K·m) or at least 0.9 W/(K·m).

The thermal conductivity between the outer surface of the accommodation mandrel 40 and the inner surface of the shaft 30 per unit axial length of the outer surface of the accommodation mandrel 40 may be maximally 9 W/(K·m), maximally 8 W/(K·m), maximally 7 W/(K·m), maximally 6 W/(K·m) or maximally 4 W/(K·m).

A relatively large outer diameter of the accommodation mandrel 40 of at least 15 mm or at least 20 mm offers a larger surface area for better energy transfer to the shaft 40.

The material of the accommodation mandrel 40 may be selected such that it exhibits good heat conduction so that there is no noteworthy temperature difference between the inner and the outer surface of the accommodation mandrel 40 during operation. The accommodation mandrel 40 may contain, for example, structural steel or consist of structural steel.

Preferably, the accommodation mandrel is black-oxide finished to blacken the surface.

The accommodation mandrel 40 is configured as a purely passive component. Since the accommodation mandrel 40 does not exhibit any wear during operation, it is not subject to any replacement interval. Therefore, the accommodation mandrel 40 can be mounted in the treatment machine without the need that the accommodation mandrel 40 has to be replaceable from the outside. This allows, for example, to select an outer diameter of the accommodation mandrel 40 being larger than an inner diameter of a bearing for the shaft 30.

Figure 3:
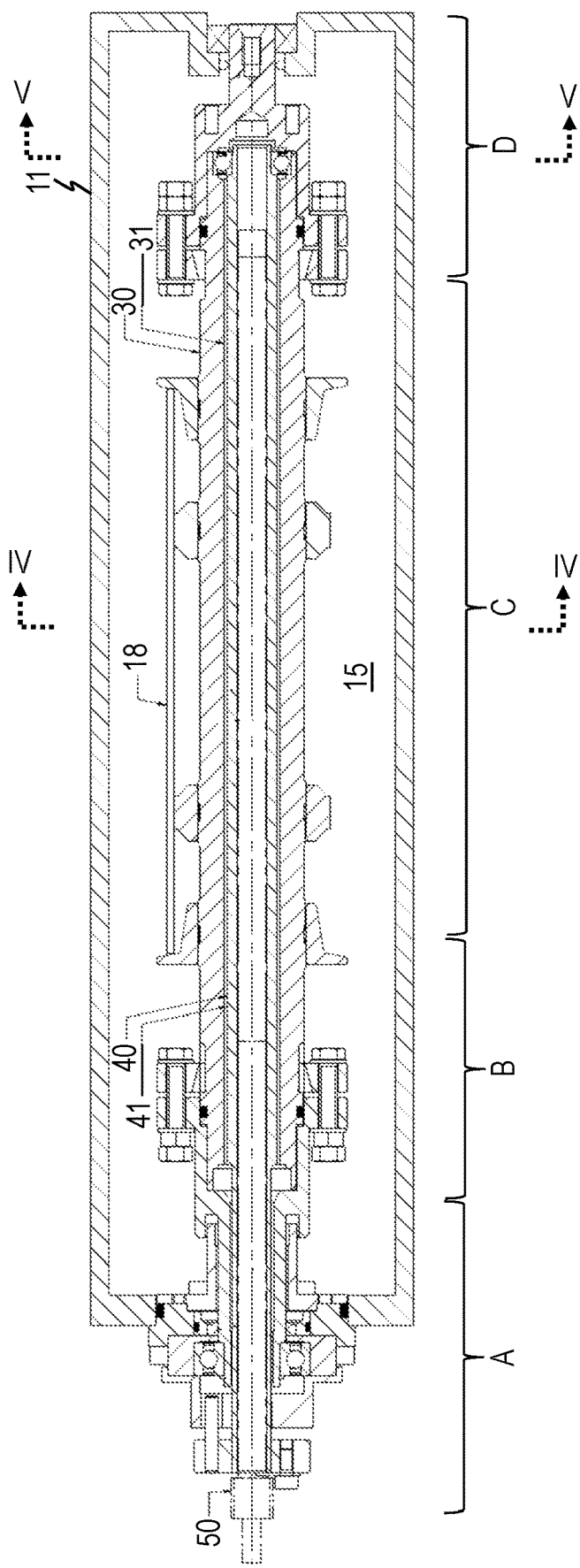
FIG. 3 shows a sectional view through the treatment machine in a sectional plane containing the rotation axis of the temperature-controlled shaft.

FIG. 3 shows a sectional view through a treatment machine with a chamber 11 and a drive unit, which comprises a rotatably supported shaft 30 and an electrical heating arrangement. The electrical heating arrangement comprises an accommodation mandrel 40, in which an electrical heating device 50 can be reversibly detachably mounted. The accommodation mandrel 40 forms a component of the electrical heating arrangement, wherein a heating cartridge or other electrical heating element 50 is insertable into the accommodation mandrel 40 such that it is again removable from the accommodation mandrel 40.

The shaft 30 may be configured as a transport roller. Contact surfaces on the shaft 30 may be used to laterally guide and/or support a substrate 18 or a substrate carrier 18. The shaft 30 is not limited to such a configuration. For example, the shaft 30 may also rotate a holder for a substrate while a substrate is treated. The shaft 30 does not have to extend in a horizontal direction through the chamber 11, but may also extend, for example, in a vertical direction into or through the chamber 11.

Figure 4:
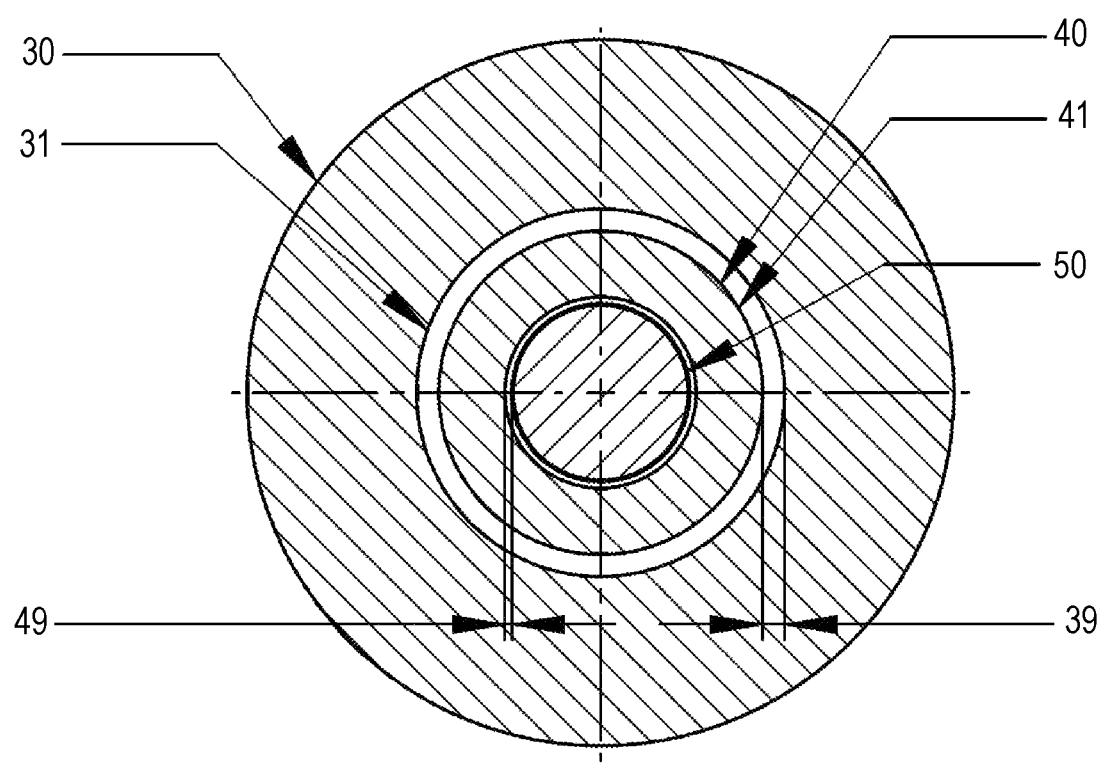
FIG. 4 shows a sectional view in a sectional plane perpendicular to the rotation axis of the temperature-controlled shaft along the line IV-IV indicated in FIG. 3.

FIG. 4 shows a sectional view in a sectional plane perpendicular to the rotation axis of the shaft 30 at the position indicated by IV-IV in FIG. 3.

The shaft 30, which is rotatably supported relative to the chamber 11, comprises an inner surface 31. The inner surface 31 may be blackened for better heat transfer.

The accommodation mandrel 40, which is not rotatable relative to the chamber 11, comprises an outer surface 41. The outer surface 41 may be blackened for better heat transfer.

As schematically shown in FIG. 4, the accommodation mandrel 40 may have a relatively large ratio of its wall thickness to its outer diameter. For example, at least in a central plane of the accommodation mandrel 40 perpendicular to the longitudinal axis of the accommodation mandrel 40, a ratio of the wall thickness of the accommodation mandrel 40 to the outer diameter of the accommodation mandrel 40 may be at least 0.1, at least 0.15 or at least 0.2.

The outer surface 41 of the accommodation mandrel 40 is spaced apart from the inner surface 31 of the shaft 30 by a gap 39. By a further gap 49, an inner surface of the accommodation mandrel 40 may be spaced apart from an outer surface of the electrical heating device 50, for example the heating cartridge, which is inserted into the accommodation mandrel 40 during operation.

The gap 39 between the outer surface 41 of the accommodation mandrel 40 and the inner surface 31 of the shaft 30 may be from 0.3 mm to 4 mm, from 0.5 mm to 3 mm, from 0.7 mm to 2.2 mm or from 1 mm to 1.9 mm.

The further gap 49 between the outer surface of the heating cartridge 50 and the inner surface of the accommodation mandrel 40 may be at most 1 mm, at most 0.5 mm or at most 0.25 mm.

The shaft 30 and/or the accommodation mandrel 40 may have a varying cross-section along a longitudinal direction of the shaft 30 and the accommodation mandrel 40. For example, a wall thickness and/or an outer diameter of the accommodation mandrel 40 may vary along the longitudinal direction of the accommodation mandrel 40. The wall thickness and/or the outer diameter of the accommodation mandrel 40 may decrease in a direction from a center of the accommodation mandrel 40 towards one of the chamber walls 12, 13 or towards both chamber walls 12, 13. Thereby, it is possible to take account of the fact that good heat transfer between the accommodation mandrel 40 and the shaft 30 is typically not required in the end areas of the accommodation mandrel 40. Alternatively or additionally, available space may be created between the accommodation mandrel 40 and the shaft 30, for example, for mounting a further bearing 60 (also shown in FIG. 9).

Figure 5:
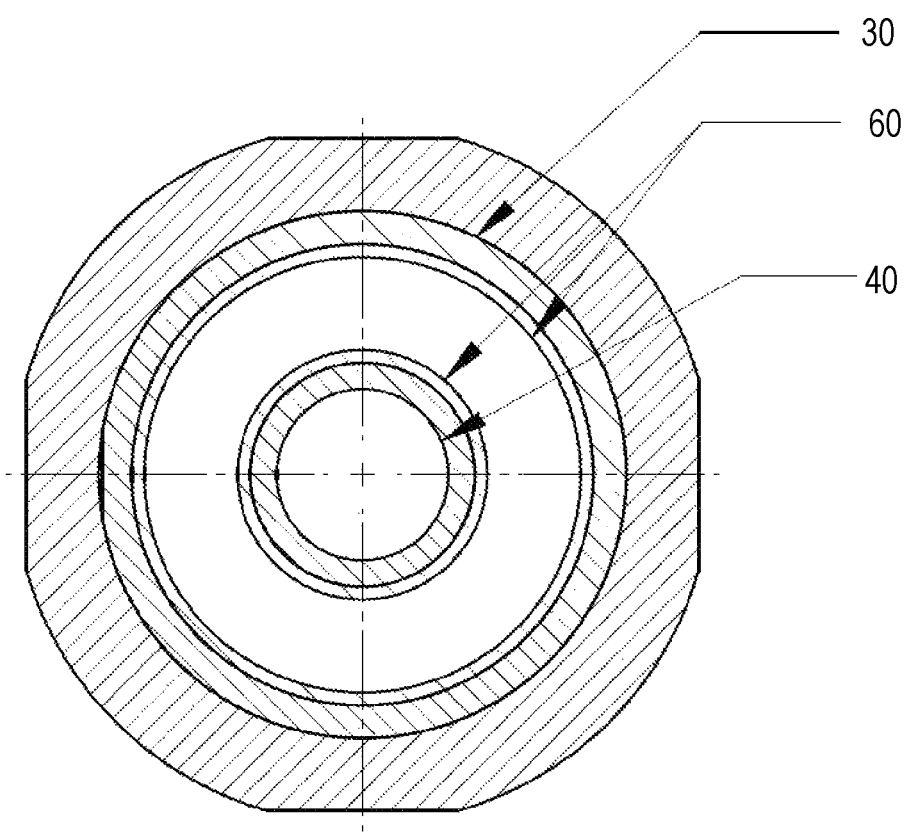
FIG. 5 shows a sectional view in a sectional plane perpendicular to the rotation axis of the temperature-controlled shaft along the line V-V indicated in FIG. 3.

FIG. 5 shows a sectional view in a sectional plane perpendicular to the rotation axis of the shaft 30 at the position indicated by V-V in FIG. 3, wherein the sectional plane extends through the further bearing 60 between the accommodation mandrel 40 and the shaft 30. As can be seen in both FIG. 5 and FIG. 9, the wall thickness and/or outer diameter of the accommodation mandrel 40 may decrease from a central plane of the treatment machine located between the side walls 12, 13 towards one or both side walls 12, 13.

Optional additional configuration features of the treatment machine and drive unit are described with reference to FIGS. 6, 7, 8 and 9. It is understood that the described features do not have to be cumulatively present, but that the described features can be used in any combinations.

FIGS. 6, 7, 8 and 9 show details of the portions of the treatment machine denoted by the letters A, B, C and D in FIG. 3.

Figure 6:
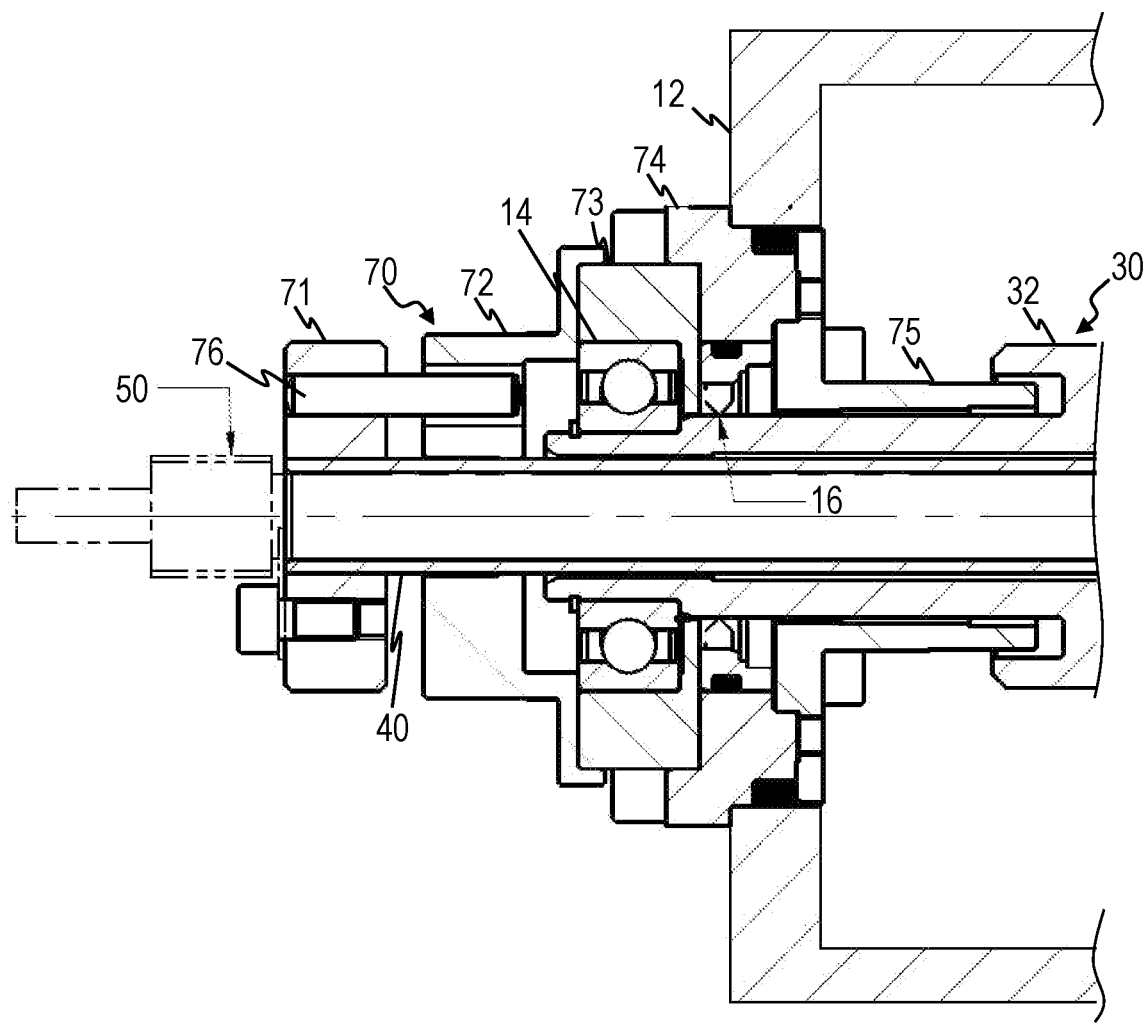
FIG. 6 shows a partial sectional view through the treatment machine in the area denoted by A in FIG. 3 in a sectional plane containing a rotation axis of a temperature-controlled shaft.

FIG. 6 shows a partial view of a treatment machine according to a preferred embodiment. An electrical heating arrangement comprises the accommodation mandrel 40, which is mounted at a wall 12 of the chamber 11 such that it does not rotate relative to said chamber. The electrical heating arrangement may comprise a heating cartridge 50 or any other electrical heating device which is inserted into the accommodation mandrel 40 during operation. The rotatably supported shaft 30 is rotatably supported at the chamber 11 via a bearing 14.

A mounting arrangement 70 may be provided to fix the accommodation mandrel 40 in a non-rotating manner to the chamber 11 and to rotatably support the shaft 30. The mounting arrangement 70 may be configured as a multi-part arrangement with a plurality of components 71, 72, 73, 74, 75 and 76. For example, one or more fixing components 72 of the mounting arrangement 70 projecting outwards from the chamber wall 12 may support one end of the accommodation mandrel 40 such that a longitudinal axis of the accommodation mandrel 40 coincides with a rotation axis of the shaft 30.

A static guide (not shown in FIG. 6) may be used to support the accommodation mandrel 40, said static guide fixing the accommodation mandrel in relation to the fixing component 72. This guide may be attached to the fixing component 72 or be configured to be integral with the fixing component 72. It can thus be ensured that the longitudinal axis of the accommodation mandrel 40 coincides with the rotation axis of the shaft 30.

The mounting arrangement 70 may comprise one or more components that secure the accommodation mandrel 40 against rotation. In order to secure the accommodation mandrel 40 against rotation, for example, the fixing components 71 and 72 may be connected to each other by means of a pin 76. The fixing component 71 may be separably connected to the accommodation mandrel 40.

A bearing component 73 of the mounting arrangement 70 may be connected to an outer ring of the bearing 14. Sealing components 74 may be provided to securely seal the treatment space 15 of the chamber 11, wherein said sealing components may comprise one seal 16 or a plurality of seals and hold them in position. The hollow cylinder 75 is used to shadow the vapor jet so that no deposits are formed on the seal 16.

Figure 7:
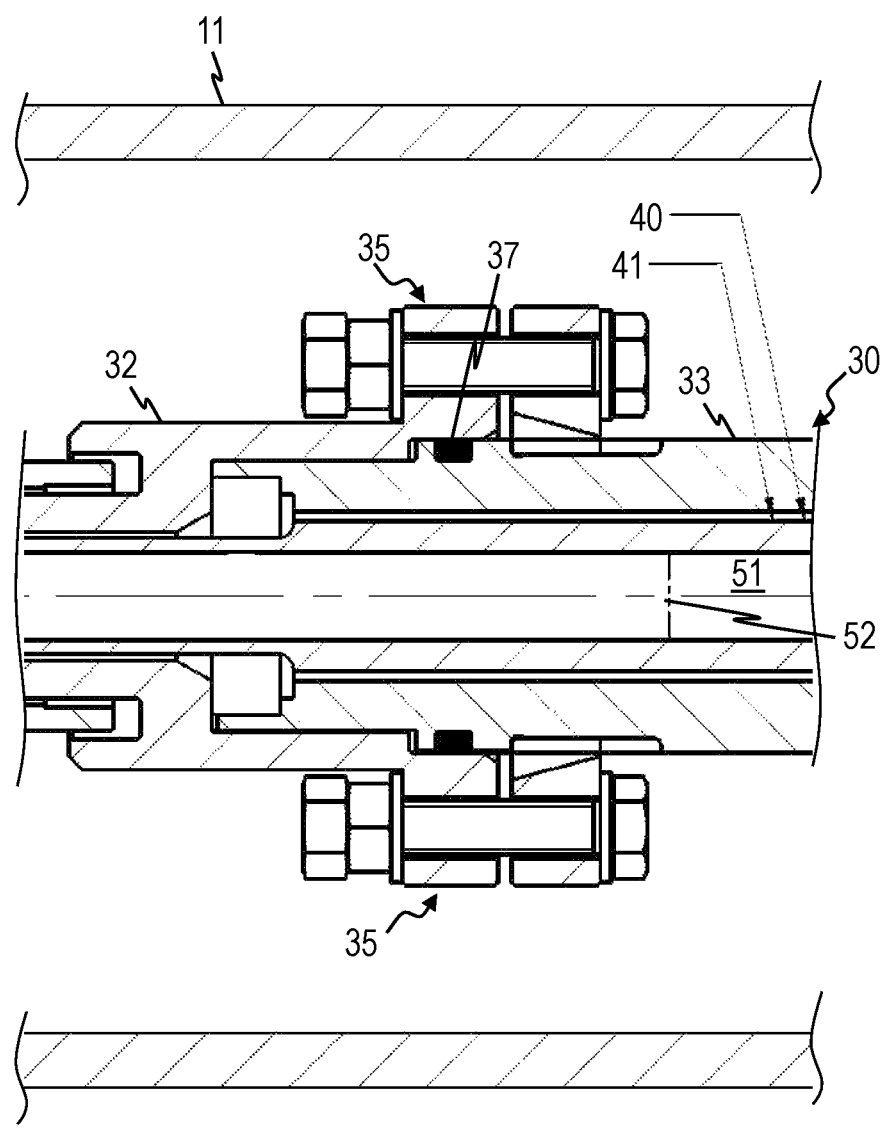
FIG. 7 shows a partial sectional view through the treatment machine in the area denoted by B in FIG. 3 in a sectional plane containing a rotation axis of a temperature-controlled shaft.
Figure 9:
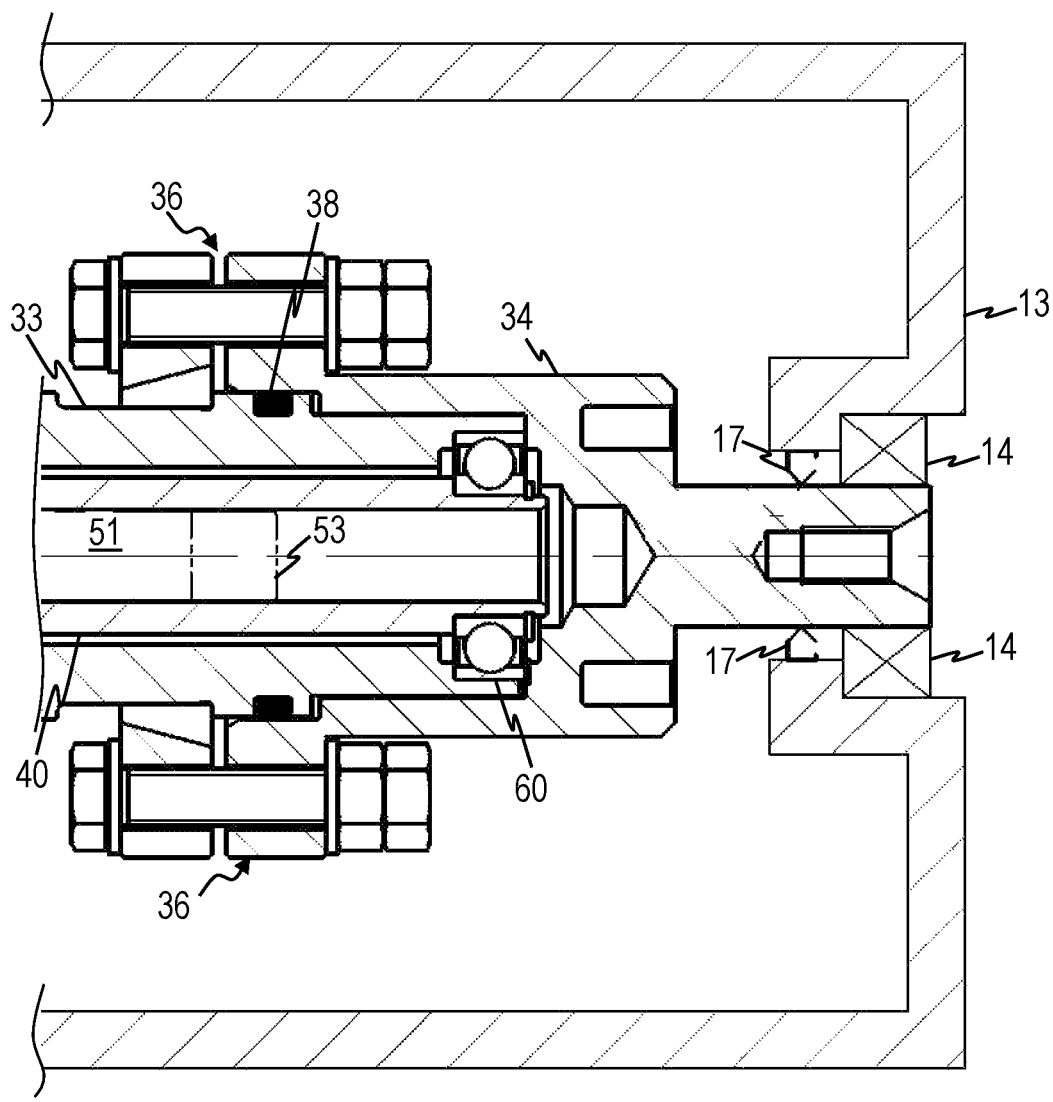
FIG. 9 shows a partial sectional view through the treatment machine in the area denoted by D in FIG. 3 in a sectional plane containing a rotation axis of a temperature-controlled shaft.

As shown in FIG. 3, FIG. 7 and FIG. 9, the shaft 30 may be configured as a multi-part shaft. The shaft 30 may comprise a plurality of shaft portions 32, 33, 34. The shaft portions 32 and 33 may be connected to each other in a gas-tight manner by means of connectors 35. The shaft portions 33 and 34 may be connected to each other in a gas-tight manner by means of further connectors 36. Seals 37, 38 may be provided at the connection sites to seal the inner volume of the shaft 30 in a gas-tight manner against the treatment space 15.

The heating cartridge 50 or any other electrical heating device 50 comprises an area 51 that contains all active heating elements of the electrical heating device. The heating cartridge 50 or other electrical heating device 50 may be configured such that there are no active heating elements outside the area 51. Ends 52, 53 of the area 51 containing the active heating elements (most clearly visible in FIG. 7 and FIG. 9) are positioned such that the ends 52, 53 of the area 51 are spaced apart from the seals and/or bearings 14, 60 in the longitudinal direction of the shaft 30. The seals and/or bearings 14, 60 are positioned such that they do not overlap with the area 51 containing all active heating elements when viewed in the axial direction of the shaft 30.

Figure 8:
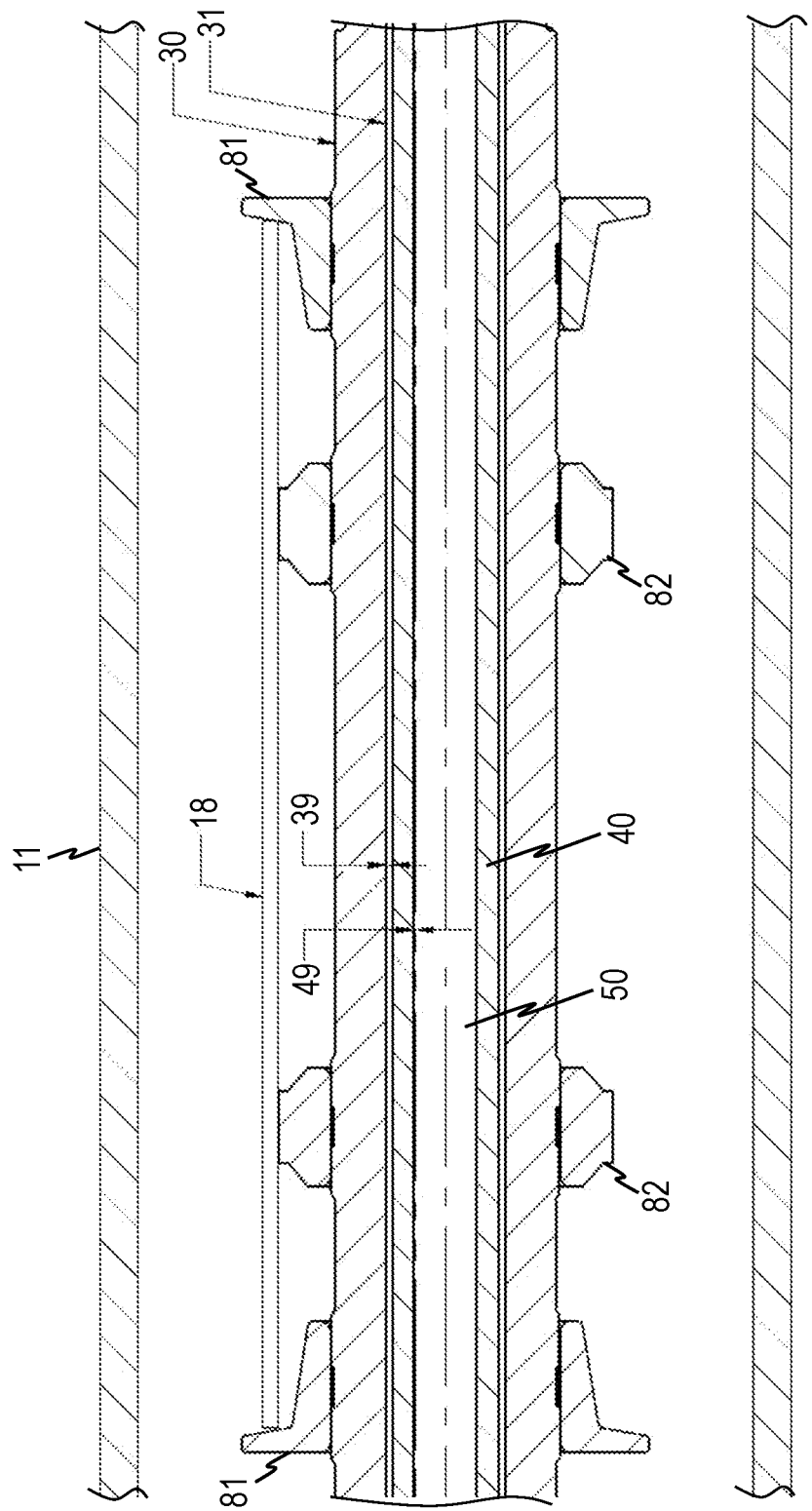
FIG. 8 shows a partial sectional view through the treatment machine in the area denoted by C in FIG. 3 in a sectional plane containing a rotation axis of a temperature-controlled shaft.

FIG. 8 shows a central area along the longitudinal direction of the shaft 30. As already explained with reference to FIG. 4, the inner surface 31 of the shaft 30 in the central area is spaced apart from the outer surface 41 of the accommodation mandrel 40 by a gap 39, which is larger than a gap between the heating cartridge 50 or any other electrical heating device 50 and the inner surface of the accommodation mandrel 40.

The shaft 30 may be configured as a drive roller. The shaft 30 may be used in a continuous machine or a batch-type machine. Guide elements 81 for laterally guiding the substrate 18 or the substrate carrier 18 may be arranged at the shaft 30. Support elements 82 for supporting a lower side of the substrate 18 or the substrate carrier 18 may be arranged at the shaft 30. The guide elements 81 and/or support elements 82 may be circumferentially arranged around the shaft 30.

FIG. 9 shows a partial view of a treatment machine according to a preferred embodiment. The rotatably supported shaft 30 is rotatably supported at the chamber 11 via a bearing 14. A further bearing 60 may be arranged between the accommodation mandrel 40 and the shaft 30. Active heating elements are arranged in the heating cartridge 50 or the other heating device 50 such that they do not extend beyond an end 53 of an area 51 which ends at a distance from bearing 60.

Seals 17 may be provided to ensure that treatment space 15 in the chamber 11 can be evacuated to a static pressure of less than 1 Pa, in particular less than 0.1 Pa, less than $10^{-2}$ Pa, less than $10^{-3}$ Pa or less than $10^{-4}$ Pa.

Figure 10:
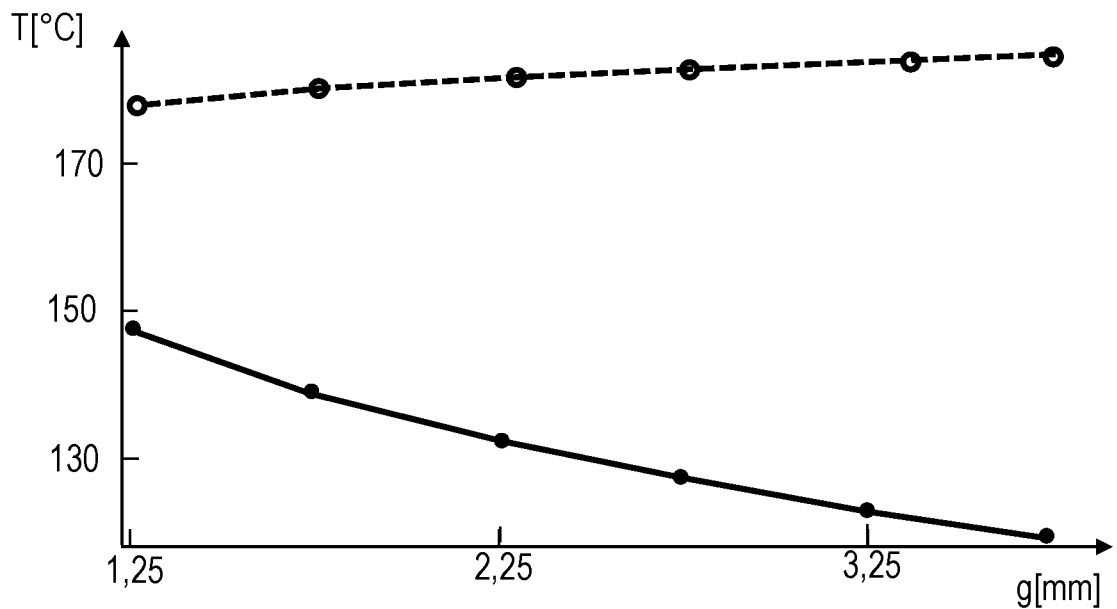
FIG. 10 shows a dependence of a temperature of the shaft on the distance between an outer surface of an accommodation mandrel and an inner surface of the shaft.
Figure 11:
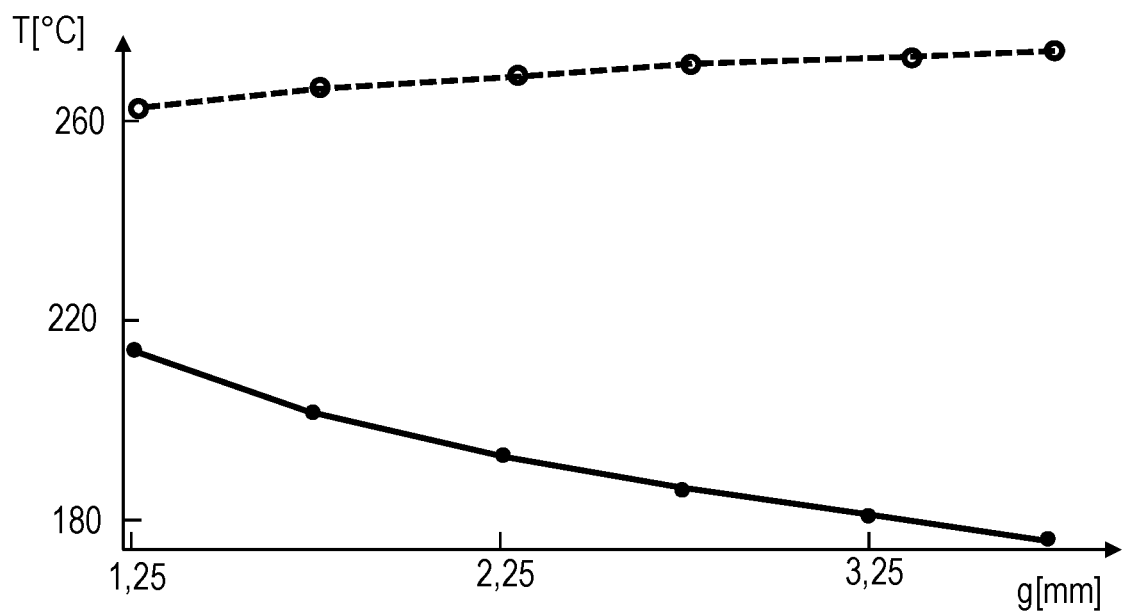
FIG. 11 shows a dependence of a temperature of the shaft on the distance between an outer surface of an accommodation mandrel and an inner surface of the shaft.
Figure 12:
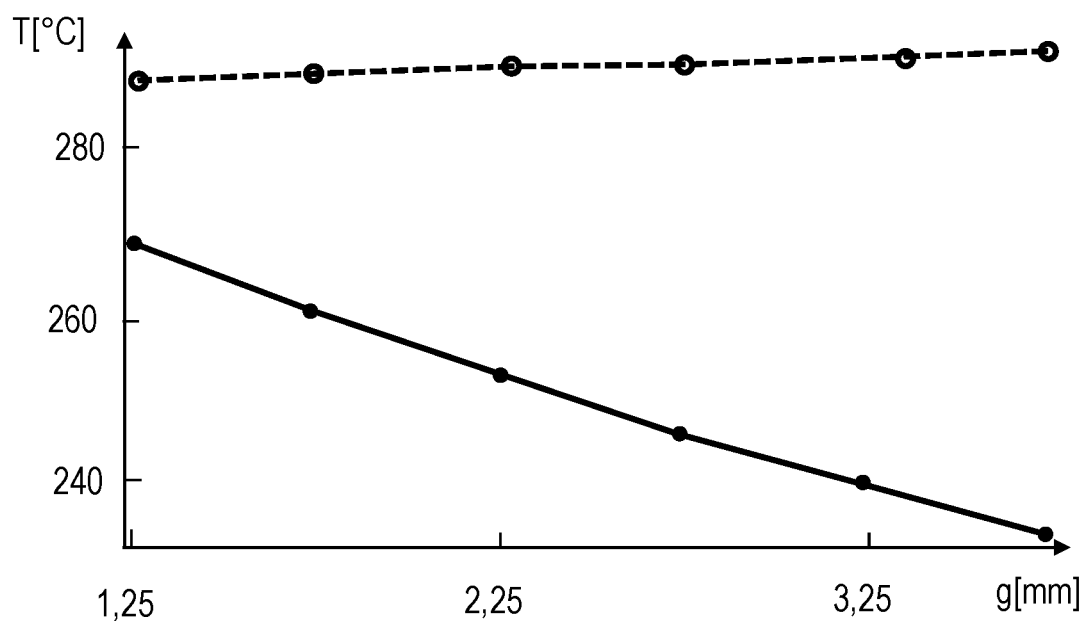
FIG. 12 shows a dependence of a temperature of the shaft on the distance between an outer surface of an accommodation mandrel and an inner surface of the shaft.

Each of FIG. 10, FIG. 11 and FIG. 12 shows a temperature of the outer surface of the accommodation mandrel 40 (open circles and broken lines) as well as a temperature of the outer surface of the shaft 30 (filled circles and solid lines) as a function of a distance g (which corresponds to the distance 39 shown in FIG. 4 and FIG. 8) between the outer surface 41 of the accommodation mandrel 40 and the inner surface 31 of the shaft 30. As regards the data shown in FIG. 10, FIG. 11 and FIG. 12, the shaft 30 has an outer radius of 23 mm and an inner radius of 12.5 mm. The accommodation mandrel 40 has an inner radius of 6.25 mm. The wall thickness of the accommodation mandrel 40 varies between 5.5 mm and 3 mm so that the distance g between the outer surface 41 of the accommodation mandrel 40 and the inner surface 31 of the shaft 30 varies from 0.75 mm to 3.25 mm.

In FIG. 10, the temperature of the heating cartridge is 200° C., and the gap between the outer surface 41 of the accommodation mandrel 40 and the inner surface 31 of the shaft 30 is filled with air.

In FIG. 11 the temperature of the heating cartridge is 300° C., and the gap between the outer surface 41 of the accommodation mandrel 40 and the inner surface 31 of the shaft 30 is filled with air.

In FIG. 12, the temperature of the heating cartridge is 300° C., and the gap between the outer surface 41 of the accommodation mandrel 40 and the inner surface 31 of the shaft 30 is filled with helium.

As illustrated by FIG. 10, FIG. 11 and FIG. 12, the heat transfer to the shaft 30 can be improved and the shaft 30 can be heated to a higher temperature when using a smaller gap between the outer surface 41 of the accommodation mandrel 40 and the inner surface 31 of the shaft 30 (i.e., when using a larger outer diameter d of the accommodation mandrel 40).

As revealed by a comparison between FIG. 11 and FIG. 12, the heat transfer to the shaft 30 can be improved and the shaft 30 can be heated to a higher temperature by using helium as a gas in the gap between the outer surface 41 of the accommodation mandrel 40 and the inner surface 31 of the shaft 30 than by using air in the inner volume of the shaft 30.

A plurality of drive units having the configuration described in detail with reference to FIG. 2 to FIG. 12 may be provided at a single treatment machine.

The treatment machine and/or drive unit may be used for different purposes. For example, the treatment machine may be configured as a vapor deposition machine. The treatment machine may be configured to deposit chalcogens, for example selenium. To this end, the treatment machine may comprise at least one vapor source for a reaction vapor. Alternatively or additionally, the treatment machine may be configured for gas phase deposition and comprise at least one source of reaction gas. Alternatively or additionally, the treatment machine or the drive unit may be used for a thermal treatment of substrates/layers deposited onto the substrates.

The heating cartridge 50 or any other heating device 50 may be controlled in an open loop or in a closed loop mode via a thermocouple element or a plurality of thermocouple elements.

The accommodation mandrel 40 may be configured in different ways depending on the desired application. The accommodation mandrel 40 is advantageously configured such that a ratio of its wall thickness to its outer diameter in a central plane of the chamber may be, for example, at least 0.1, at least 0.15 or at least 0.2. The accommodation mandrel 40 advantageously contains structural steel or consists of structural steel.

In an exemplary embodiment, the static accommodation mandrel 40, which does not rotate along with the shaft 30, may be configured to accommodate a standard electrical heating cartridge. The heating cartridge may transfer heat energy to the accommodation mandrel 40 via a small gap, which, for example, may be maximally 0.5 mm or maximally 0.25 mm. Thus, it is ensured that the heating cartridge can efficiently transfer its heat energy and does not overheat. Negative influences on the lifetime of the heating cartridge 50 can be prevented.

Due to the relatively large wall thickness of the accommodation mandrel 40, the accommodation mandrel 40 can efficiently absorb heat energy and then transfer it to the rotatably supported shaft. The wall thickness of the accommodation mandrel may be, for example, at least 2 mm, at least 3 mm, at least 4 mm or approximately 4.5 mm in a central plane of the chamber 11. Such a configuration is particularly suitable for shaft lengths of more than 600 mm, without being limited thereto.

The drive unit and treatment machine according to various embodiments allow a temperature control of a shaft 30 rotating during operation, in particular a heating of the shaft 30 rotating during operation. The problems with leakages at rotary transmission feedthroughs, which often occur in the case of shafts with temperature control by means of oil, can be avoided. Due to the use of an accommodation mandrel 40 into which a heating cartridge 50 or any other electrical heating device 50 can be inserted as a replacement part, it is not necessary to contact the heating cartridge 50 via a slip ring contact. Due to the configuration of the accommodation mandrel 40 as a passive component, a simple design can be implemented. Efficient heat transfer to the shaft 30 can be achieved by a gas in the gap between the accommodation mandrel 40 and the shaft 30.

Embodiments of the invention may be advantageously used for machines for vapor phase deposition, gas phase deposition and/or thermal treatment of substrates, without being limited thereto. Embodiments of the invention may be advantageously used in continuous machines or batch-type machines.

The invention claimed is:

1. A treatment machine comprising:
   a chamber for treatment of one substrate or a plurality of substrates,
   a rotatably supported temperature-controlled shaft, wherein said shaft defines a cylindrical, gas-tight hollow space, wherein the shaft is made of metal or metal alloy, and
   a heating arrangement for electrically heating at least a part of the shaft arranged in the chamber,
   wherein said heating arrangement comprises an accommodation mandrel for accommodating at least one electrical heating element, said accommodation mandrel being arranged in a non-rotating manner and extending into the hollow space of the shaft,
   wherein an outer surface of the accommodation mandrel is spaced apart from an inner surface of the shaft by a gap.

2. The treatment machine according to claim 1, wherein the shaft is configured to be dividable, wherein dividable connections of the shaft are provided with a seal to seal a volume defined between the accommodation mandrel and the inner surface of the shaft against a treatment space defined by the chamber.

3. The treatment machine according to claim 1, further comprising an evacuation device for evacuating a treatment space defined by the chamber, wherein the treatment space is evacuable to a static pressure of less than 0.1 Pa.

4. The treatment machine according to claim 1, wherein said treatment machine is configured to maintain an overpressure in a volume defined between the accommodation mandrel and the shaft relative to a treatment space defined by the chamber and/or to maintain a pressure in the volume defined between the accommodation mandrel and the shaft at atmospheric pressure when evacuating the treatment space.

5. The treatment machine according to claim 1, wherein the gap between the outer surface of the accommodation mandrel and the inner surface of the shaft is smaller than 3 mm.

6. The treatment machine according to claim 1, wherein a thermal conductivity between the outer surface of the accommodation mandrel having a diameter of at least 15 mm and the inner surface of the shaft per unit of axial length of the outer surface of the accommodation mandrel is at least 0.4 W/(K·m).

7. The treatment machine according to claim 1, wherein the shaft is rotatably connected to the chamber via at least one bearing, further comprising at least one bearing between the accommodation mandrel and the inner surface of the shaft.

8. The treatment machine according to claim 1, wherein the accommodation mandrel defines a further cylindrical hollow space in its interior, the treatment machine further comprising a heating cartridge, which is or can be arranged in the further cylindrical hollow space of the accommodation mandrel.

9. The treatment machine according to claim 8, wherein the further cylindrical hollow space comprises a material between the heating cartridge and the accommodation mandrel, wherein said material has a thermal conductivity of at least 0.05 W/(K·m).

10. The treatment machine according to claim 9, wherein said material has a thermal conductivity of at least 4 W/(K·m).

11. The treatment machine according to claim 1, wherein the at least one electrical heating element is an integral component of the accommodation mandrel.

12. The treatment machine according to claim 1, wherein the accommodation mandrel can be removed from the hollow space of the shaft to replace the at least one electrical heating element.

13. The treatment machine according to claim 12, wherein the accommodation mandrel is supported at its distal end in the hollow space of the shaft and comprises a taper at its distal end to be inserted into a bearing.

14. The treatment machine according to claim 1, wherein the gap between the outer surface of the accommodation mandrel and the inner surface of the shaft is greater than 0.3 mm.

15. The treatment machine according to claim 1, wherein the outer surface of the accommodation mandrel and/or the inner surface of the shaft are blackened.

16. The treatment machine according to claim 1, wherein the outer surface of the accommodation mandrel is cylindrical along at least a portion of the accommodation mandrel.

17. The treatment machine according to claim 16, wherein the outer surface of the accommodation mandrel comprises portions having different outer diameters arranged along an axis of the accommodation mandrel.

18. The treatment machine according to claim 8, further comprising a seal or a bearing, wherein a configuration of the heating cartridge is adapted to a position of the seal or the bearing, wherein the heating cartridge is configured such that an area of the heating cartridge containing active heating elements ends at a distance from the seal or the bearing.

19. The treatment machine according to claim 8, wherein an outer surface of the heating cartridge arranged in the accommodation mandrel is spaced apart from an inner surface of the accommodation mandrel by at most 1 mm.

20. The treatment machine according to claim 1, wherein said treatment machine is a plant for thermal treatment.

21. The treatment machine according to claim 20, further comprising a temperature control for controlling a temperature of the at least one electrical heating element located in the accommodation mandrel.

22. A treatment machine comprising:
    a chamber the treatment of one substrate or a plurality of substrates,
    a rotatably supported temperature-controlled shaft, wherein said shaft defines a cylindrical, gas-tight hollow space,
    a heating arrangement for electrically heating at least a part of the shaft arranged in the chamber, wherein said heating arrangement comprises an accommodation mandrel for accommodating at least one electrical heating element, said accommodation mandrel being arranged in a non-rotating manner and extending into the hollow space of the shaft, wherein an outer surface of the accommodation mandrel is spaced apart from an inner surface of the shaft by a gap, and
    a gaseous medium disposed in the gap between the outer surface of the accommodation mandrel and the inner surface of the shaft.

23. A treatment machine comprising:
    a chamber for treatment of one substrate or a plurality of substrates,
    a rotatably supported temperature-controlled shaft, wherein said shaft defines a cylindrical, gas-tight hollow space, a plurality of support elements disposed around the shaft and configured to support a lower side of the one substrate or the plurality of substrates and provide a separation between the shaft and the one substrate or the plurality of substrates, and a heating arrangement for electrically heating at least a part of the shaft arranged in the chamber, wherein said heating arrangement comprises an accommodation mandrel for accommodating at least one electrical heating element, said accommodation mandrel being arranged in a non-rotating manner and extending into the hollow space of the shaft, wherein an outer surface of the accommodation mandrel is spaced apart from an inner surface of the shaft by a gap.

* * * * *